United States Patent [19]

Hishida et al.

[11] 4,234,811
[45] Nov. 18, 1980

[54] SUPPORTING STRUCTURE FOR A THICKNESS-SHEAR TYPE CRYSTAL OSCILLATOR FOR WATCHES

[75] Inventors: Hiroshi Hishida, Sayama; Toshihiko Nakayama, Tokorozawa; Isao Koyama, Kodaira; Hisao Wakabayashi, Higashikurume, all of Japan

[73] Assignee: Citizen Watch Co., Ltd., Tokyo, Japan

[21] Appl. No.: 867,303

[22] Filed: Jan. 5, 1978

[30] Foreign Application Priority Data

Jan. 14, 1977 [JP] Japan ................................. 52-3462

[51] Int. Cl.$^3$ .......................................... H01L 41/08
[52] U.S. Cl. .................................. 310/348; 310/353
[58] Field of Search ............................. 310/353–356, 310/348, 345

[56] References Cited

U.S. PATENT DOCUMENTS

| 2,002,167 | 5/1935 | Bechmann ...................... 310/353 X |
| 2,699,508 | 1/1955 | Fastenau, Jr. ...................... 310/353 |
| 3,988,621 | 10/1976 | Nakayama et al. .................. 310/348 |
| 4,079,281 | 3/1978 | Nakayama et al. .............. 310/348 X |

*Primary Examiner*—Mark O. Budd
*Attorney, Agent, or Firm*—Sherman & Shalloway

[57] ABSTRACT

A supporting structure for a thickness-shear type crystal oscillator for watches which has an excellent resistance to shocks, which is very compact in construction and which can support not only an annular crystal piece but also support a rectangular crystal piece is disclosed. The supporting structure comprises a supporting frame which is provided at its opposed inner periphery with tongues adapted to be engaged with corresponding notches provided on opposed end portions of a crystal piece, respectively.

1 Claim, 9 Drawing Figures

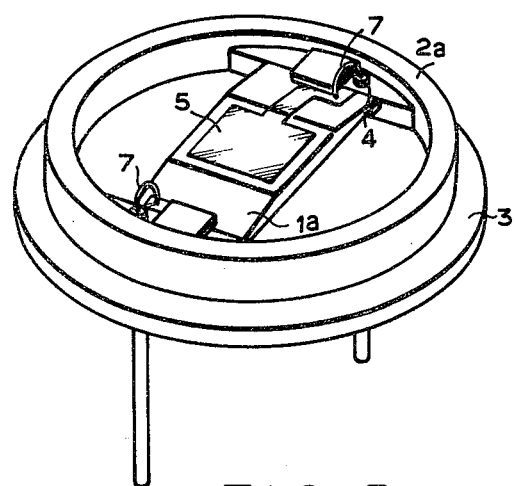
FIG. 5A
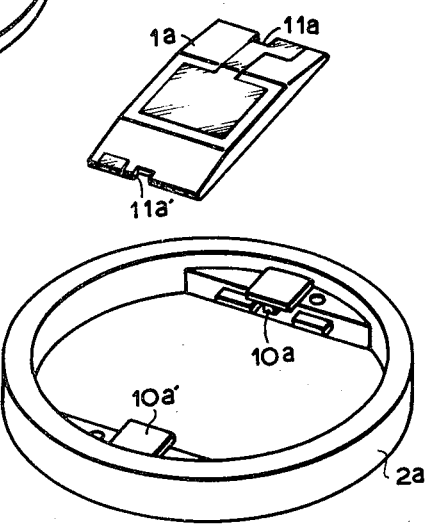
FIG. 5B
FIG. 5C
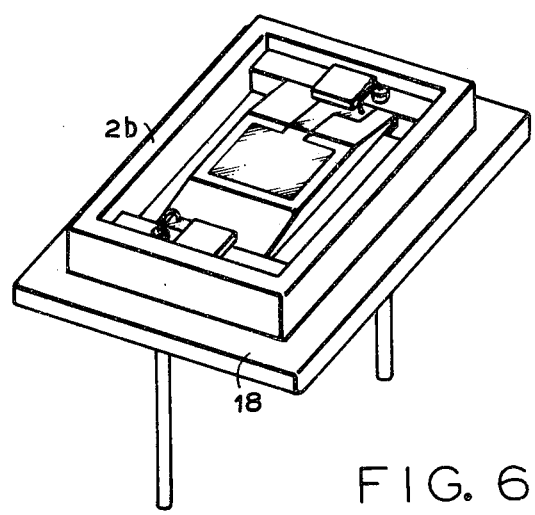
FIG. 6

SUPPORTING STRUCTURE FOR A THICKNESS-SHEAR TYPE CRYSTAL OSCILLATOR FOR WATCHES

BACKGROUND OF THE INVENTION

1. Field of the Invention

This invention relates to a supporting structure for an AT plate oscillator, i.e. a thickness-shear type crystal oscillator for watches.

2. Description of the Prior Art

Heretofore it has been the common practice to use an annular thickness-shear type crystal oscillator as shown in FIG. 1. That is, provision is made of a supporting member composed of a pair of electrically conductive supporting wires 15, 15 connected at respective rear ends to stems 17, 17 extending through an insulating substrate 18 and provided at respective front ends with coil-shaped portions 15a, 15a, respectively. Between those coil-shaped portions 15a, 15a are sandwiched diametrically opposite ends of a crystal piece 16. These ends of the crystal piece 16 are then firmly secured to the coil-shaped portions 15a, 15a by means of an electrically conductive paint or the like. Such crystal oscillator used as a time reference of a portable timepiece could not resist against shocks and oscillations subjected thereto from the outside.

In addition, a capsule 19 for enclosing the crystal piece 16 and fitted to the insulating substrate 18 becomes large in volume if compared with a size of the crystal piece, so that such crystal oscillator is not suitable for portable timepieces which are requested to be small in size.

SUMMARY OF THE INVENTION

A principal object of the invention, therefore, is to provide a supporting structure for a thickness-shear type crystal oscillator for watches, which can eliminate the above mentioned drawbacks which have been encountered with the prior art techniques.

Another object of the invention is to provide a supporting structure for a thickness-shear type crystal oscillator for watches, which has an excellent resistance to shocks.

A further object of the invention is to provide a supporting structure for a thickness-shear type crystal oscillator for watches, which is very compact in construction.

A still further object of the invention is to provide a supporting structure for a thickness-shear type crystal oscillator for watches, which can support not only a circular crystal piece, but also support a rectangular crystal piece.

Any other objects and advantages of the invention will be understood from embodiments of the invention to be described later with reference to the accompanying drawings.

BRIEF DESCRIPTION OF THE DRAWING

FIG. 5A is a perspective view showing another embodiment of a supporting structure for a thickness-shear type crystal oscillator for watches according to the invention;

FIG. 5B is a perspective view showing a crystal piece only shown in FIG. 5A;

FIG. 5C is a perspective view showing a supporting frame only shown in FIG. 5A; and FIG. 6 is a perspective view of a further embodiment of a supporting structure for a thickness-shear type crystal oscillator for watches according to the invention.

DETAILED DESCRIPTION OF THE PREFERRED EMBODIMENT

Various embodiments of a supporting structure for a thickness-shear type crystal oscillator for watches according to the invention will now be described with reference to FIGS. 2 to 6.

Figure 1:
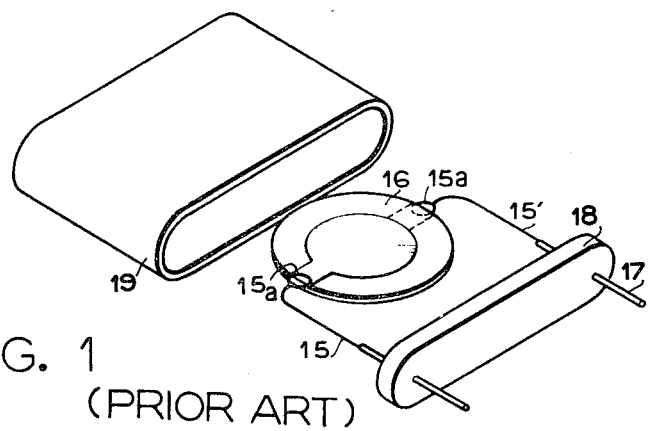
FIG. 1 is a perspective view showing a prior art supporting structure for a thickness-shear type crystal oscillator for watches.
Figure 2:
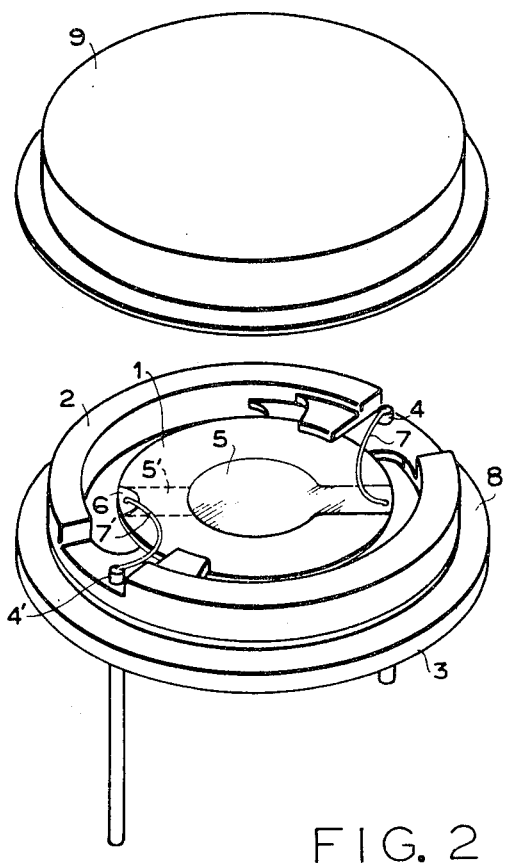
FIG. 2 is a perspective view of one embodiment of a supporting structure for a thickness-shear type crystal oscillator for watches according to the invention.

In FIG. 2 is shown a supporting structure as a whole. A crystal piece 1 is supported at its two diametrically opposite ends by a resilient annular supporting frame 2. The supporting frame 2 is provided at its diametrically opposite ends with two holes 4a, 4a' (FIG. 3A) adapted to be engaged with two pins 4, 4' provided on a ceramic substrate 3 composed of a hermetically sealed terminal disc and insulated therefrom, respectively. The crystal piece 1 is provided at its opposite surfaces with electrodes 5, 5' vapor deposited thereon. The crystal piece 1 is also provided at the same side as the electrode 5 with an auxiliary electrode 6 which is made electrically conductive with that portion of the other electrode 5' which is located at the outer periphery of the crystal piece 1. Provision is made of two thin gold wires 7, 7'. Both ends of the thin gold wire 7 are bonded with the electrode 5 and the pin 4, while both ends of the thin gold wire 7' are bonded with the auxiliary electrode 6 and the pin 4' so as to make the crystal electrodes 5, 5' electrically conductive to the pins 4, 4' which function as outside terminals, respectively. The hermetically sealed terminal disc 3 is provided near its outer periphery with a metallized portion 8 to which is soldered a cap 9 to form a hermetically sealed space therein. The hermetically sealed space is subjected to vacuum so as to contain therein an inert gas such as nitrogen or the like, thereby providing a crystal oscillator. The crystal oscillator constructed as above described is smaller in size and thinner in thickness as compared with those crystal oscillators which have heretofor been used as described above.

Figure 3A:
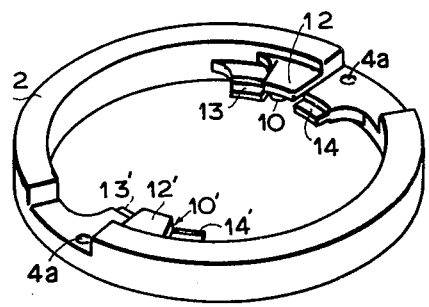
FIG. 3A is a perspective view showing a resilient annular supporting frame shown in FIG. 2.
Figure 3B:
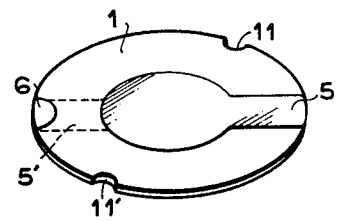
FIG. 3B is a perspective view showing a crystal piece shown in FIG. 2.
Figure 4:
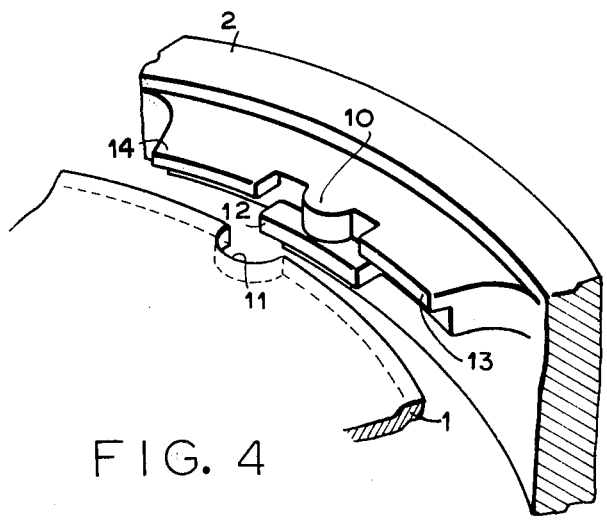
FIG. 4 is a perspective view showing a part of both a resilient annular supporting frame and a crystal piece shown in FIG. 2 in an enlarged scale.

In FIG. 3A is shown a crystal piece supporting frame 2 shown in FIG. 2 and in FIG. 3B is shown a crystal piece 1 shown in FIG. 2. The crystal piece supporting frame 2 is provided at its diametrically opposite ends adapted to support the crystal piece 1 with three tongues 12, 13, 14 and 12', 13', 14' spaced apart from each other and arranged side by side along the inner periphery of the supporting frame 2, respectively. The intermediate tongues 12, 12' are composed of semicircular projections 10, 10' which are projected from the inner periphery of the supporting frame 2, respectively, as shown in FIG. 4. The crystal piece 1 is provided at those positions which is near the electrodes 5, 5' and which are opposed to the projections 10, 10' with semicircular notches 11, 11' which engage with the semicircular projections 10, 10' and function to limit the displacement of the crystal piece 1 when a mechanical outside force is subjected thereto, therby supporting the crystal piece 1 in a stable state. As a result, no frequency charge occurs even when the crystal piece is subjected to shocks, oscillations, rotary force or the like.

In FIGS. 5A to 5C is shown another embodiment of a supporting structure for a thickness-shear type crystal oscillator for watches according to the invention. In FIGS. 5A to 5C, reference numeral 1a designates a rectangular crystal piece which is supported by an ellipse-shaped supporting frame 2a. The supporting frame 2a is provided at the ends of its long axis with rectangular projections 10a, 10a', while the crystal piece 1a is provided at its ends with rectangular notches 11a, 11a' adapted to be engaged with corresponding rectangular projections 10a, 10a', of the supporting frame 2a.

In FIG. 6 is shown a further embodiment of a supporting structure for a thickness-shear type crystal oscillator for watches according to the invention. In the present embodiment, provision is made of a rectangular supporting frame 2b which is secured to a rectangular ceramic substrate 18.

As stated hereinbefore, the use of the projections provided on the crystal supporting frame and of the notches provided on the crystal piece and adapted to be engaged with the projections ensures a positive restriction of the displacement of the crystal piece and provides the important advantage that it is impossible to provide a crystal oscillator which is small in size and thin in thickness and which has an excellent resistance to outside forces such as shocks, oscillations or the like.

What is claimed is:

1. A supporting structure for a thickness-shear type crystal oscillator for watches comprising:
    (a) a crystal piece having a peripheral notch therein;
    (b) a resilient supporting frame for firmly supporting said crystal piece;
    (c) a plurality of tongues spaced apart from each other and arranged side by side along the inner periphery of said resilient supporting frame and including grooves formed therebetween in which circumferential portions of said crystal piece are located; and
    (d) an integral projection provided on at least a specific one of said tongues for engaging the notch of said crystal piece whereby said tongues prevent axial movement of said crystal piece and said projection prevents rotational movement of said crystal piece;

wherein
    (e) said projection is perpendicular to said specific one of said tongues and extends between and is located between adjacent side by side tongues associated with said specific one of said tongues.

* * * * *